United States Patent
Yang et al.

(10) Patent No.: US 9,088,302 B2
(45) Date of Patent: Jul. 21, 2015

(54) LOW-DENSITY PARITY-CHECK CODE DECODER AND DECODING METHOD

(71) Applicants: Samsung Electronics Co., Ltd., Suwon-si (KR); Kwangwoon University Industry-Academic Collaboration Foundation, Seoul (KR)

(72) Inventors: Ho Yang, Hwaseong-si (KR); Hyun Seok Lee, Seoul (KR); Seong Sam Seo, Wando-gun (KR); Young Seok Lee, Pyeongtaek-si (KR)

(73) Assignees: Samsung Electronics Co., Ltd., Suwon-si (KR); Kwangwoon University Industry-Academic Collaboration Foundation, Seoul (KR)

( * ) Notice: Subject to any disclaimer, the term of this patent is extended or adjusted under 35 U.S.C. 154(b) by 18 days.

(21) Appl. No.: 13/862,686

(22) Filed: Apr. 15, 2013

(65) Prior Publication Data

US 2013/0283117 A1   Oct. 24, 2013

(30) Foreign Application Priority Data

Apr. 19, 2012 (KR) .................. 10-2012-0041138

(51) Int. Cl.
*H03M 13/00* (2006.01)
*H03M 13/13* (2006.01)
*H03M 13/11* (2006.01)

(52) U.S. Cl.
CPC ............ *H03M 13/13* (2013.01); *H03M 13/114* (2013.01); *H03M 13/1117* (2013.01); *H03M 13/1122* (2013.01)

(58) Field of Classification Search
CPC ...................................... H04L 1/0057
USPC .................. 714/752, 758, 773, 780, 794
See application file for complete search history.

(56) References Cited

U.S. PATENT DOCUMENTS

| 8,209,581 B2 * | 6/2012 | Yokokawa et al. ........... 714/752 |
| 8,656,247 B2 * | 2/2014 | Kyung et al. ................. 714/758 |
| 2008/0028282 A1 | 1/2008 | Zhong et al. |
| 2012/0159282 A1 * | 6/2012 | Ito ................................ 714/758 |

FOREIGN PATENT DOCUMENTS

| JP | 2007-295564 | 11/2007 |
| KR | 10-2011-0031322 | 3/2011 |
| KR | 10-2011-0043337 | 4/2011 |

* cited by examiner

Primary Examiner — Fritz Alphonse
(74) Attorney, Agent, or Firm — NSIP Law

(57) ABSTRACT

Provided is a low-density parity-check (LDPC) code decoder and a decoding method. The decoding method may include calculating a message of a variable node (V-node), calculating a message of a check node (C-node), and calculating log-likelihood ratio (LLR) data of a channel using the message of the V-node and the message of the C-node.

13 Claims, 5 Drawing Sheets

| Rate | M | \|min\| | \|submin\|-\|min\| | Index | Sign | C-node msg | Suggestion | [1] | Difference |
|---|---|---|---|---|---|---|---|---|---|
| 1/4 | 48600 | 4 | 2 | 2 | 4 | 12 | 583200 | 680400 | 97200 |
| 1/3 | 43200 | 4 | 2 | 3 | 5 | 14 | 604800 | 691200 | 86400 |
| 2/5 | 38880 | 4 | 2 | 3 | 6 | 15 | 583200 | 660960 | 77760 |
| 1/2 | 32400 | 4 | 2 | 3 | 7 | 16 | 518400 | 583200 | 64800 |
| 3/5 | 25920 | 4 | 2 | 3 | 8 | 19 | 492480 | 544320 | 51840 |
| 2/3 | 21600 | 4 | 2 | 4 | 10 | 20 | 432000 | 475200 | 43200 |
| 3/4 | 16200 | 4 | 2 | 4 | 14 | 24 | 388800 | 421200 | 32400 |
| 4/5 | 12960 | 4 | 2 | 5 | 18 | 29 | 375840 | 401760 | 25920 |
| 5/6 | 10800 | 4 | 2 | 5 | 22 | 33 | 356400 | 378000 | 21600 |
| 8/9 | 7200 | 4 | 2 | 5 | 27 | 38 | 273600 | 288000 | 14400 |
| 9/10 | 6480 | 4 | 2 | 5 | 30 | 41 | 265680 | 278640 | 12960 |

LOW-DENSITY PARITY-CHECK CODE DECODER AND DECODING METHOD

CROSS-REFERENCE TO RELATED APPLICATION(S)

This application claims the benefit under 35 USC §119(a) of Korean Patent Application No. 10-2012-0041138, filed on Apr. 19, 2012, in the Korean Intellectual Property Office, the entire disclosure of which is incorporated herein by reference for all purposes.

BACKGROUND

1. Field

The following description relates to a low-density parity-check (LDPC) code decoder and method for reducing memory usage.

2. Description of Related Art

A low-density parity-check (LDPC) code decoder typically involves a large number of operations. Accordingly, the LDPC code decoder is generally implemented as a single instruction multiple data (SIMD)-class application specific integrated circuit (ASIC). However, there are various LDPC standards which have been established. As a result, developing ASIC-type LDPC code decoders that are compliant to each of the standards can cause the decoder to be quite inefficient.

To flexibly respond to various standards, an application specific instruction processor (ASIP) is needed. However, ASIPs struggle when processing a relatively large amount of data. Also, it is difficult to implement an ASIC-type LDPC code decoder due to low compatibility.

SUMMARY

In an aspect, there is provided a decoding method for a low-density parity-check (LDPC) code decoder, the decoding method including calculating a message of a variable node (V-node), calculating a message of a check node (C-node), and calculating log-likelihood ratio (LLR) data of a channel using the message of the V-node and the message of the C-node, wherein the calculating of the message of the V-node, the calculating of the message of the C-node, and the calculating of the LLR data of the channel, for each of a plurality of layers, are repeatedly performed.

The calculating of the message of the V-node may comprise calculating a message of a V-node corresponding to a current layer using LLR data of a channel corresponding to a previous layer and a message of a C-node corresponding to previous repetitions.

The calculating of the message of the C-node may comprise calculating a message of a C-node of a current layer using messages of all V-nodes associated with the C-node of the current layer.

The calculating of the message of the V-node may comprise calculating a message of a V-node of a current layer using a min-sum algorithm.

The calculating of the message of the V-node may comprise calculating a message of a V-node of a current layer using a first absolute minimum value ($|min|$) of a message of each V-node connected to the C-node, a most significant bit ($f(|submin|_{MSB})$) for a function value associated with a second absolute minimum value aside from the first absolute minimum value, a position (Index) of a V-node having an absolute minimum value, and sign bits of each of the V-nodes.

The function value associated with the second absolute minimum value may correspond to a difference between the second absolute minimum value and the first absolute minimum value.

The function value associated with the second absolute minimum value may correspond to the second absolute minimum value.

In an aspect, there is provided a low-density parity-check (LDPC) code decoder including a first calculator configured to calculate a message of a variable node (V-node), a second calculator configured to calculate a message of a check node (C-node), and a third calculator configured to calculate log-likelihood ratio (LLR) data of a channel using the message of the V-node and the message of the C-node, wherein the decoder calculates the message of the V-node, the message of the C-node, and the LLR data of the channel, for each of a plurality of layers, repeatedly.

The first calculator may calculate a message of a V-node corresponding to a current layer using LLR data of a channel corresponding to a previous layer and a message of a C-node corresponding to previous repetitions.

The second calculator may calculate a message of a C-node of a current layer using messages of all V-nodes associated with the C-node of the current layer.

The first calculator may calculate a message of a V-node of a current layer using a min-sum algorithm.

The first calculator may calculate a message of a V-node of a current layer using a first absolute minimum value ($|min|$) of a message of each V-node connected to the C-node, a most significant bit ($f(|submin|_{MSB})$) for a function value associated with a second absolute minimum value aside from the first absolute minimum value, a position (Index) of a V-node having an absolute minimum value, and sign bits of each of the V-nodes.

The function value associated with the second absolute minimum value may correspond to a difference between the second absolute minimum value and the first absolute minimum value.

The function value associated with the second absolute minimum value may correspond to the second absolute minimum value.

In an aspect, there is provided a non-transitory computer-readable recording medium comprising a program for implementing the method described herein.

Other features and aspects will be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, description of well-known functions and constructions may be omitted for increased clarity and conciseness.

Figure 1:
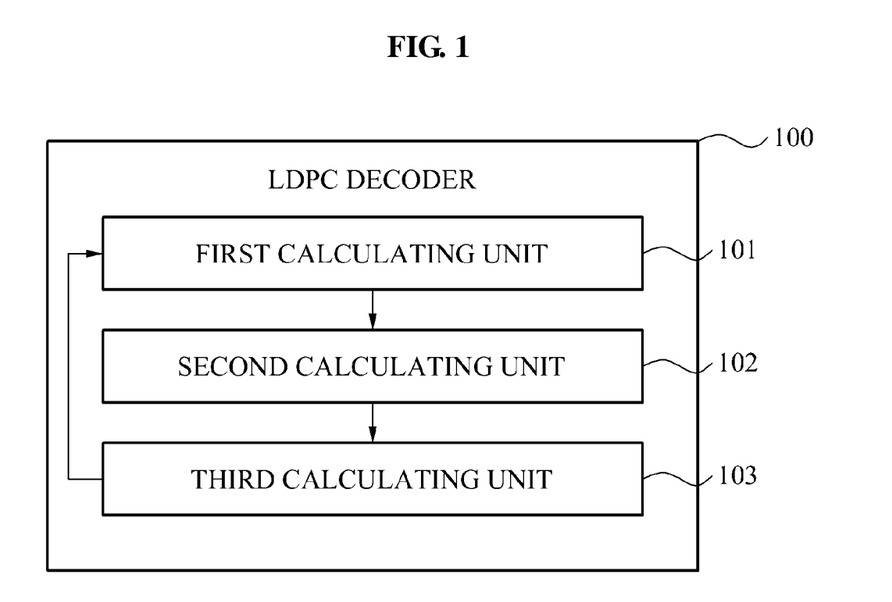
FIG. 1 is a diagram illustrating an example of a low-density parity-check (LDPC) code decoder.

FIG. 1 illustrates an example of a low-density parity-check (LDPC) code decoder 100.

Referring to FIG. 1, the LDPC code decoder 100 includes a first calculating unit 101, a second calculating unit 102, and a third calculating unit 103. For example, the LDPC code decoder 100 may decode LDPC codes for each of a plurality of layers, repeatedly, through the first calculating unit 101, the second calculating unit 102, and the third calculating unit 103.

The first calculating unit 101 may calculate a message of a variable node (V-node). As an example, the first calculating unit 101 may calculate a message of a V-node corresponding to a current layer using log-likelihood ratio (LLR) data of a channel corresponding to a previous layer and a message of a check node (C-node) corresponding to previous repetitions. In this example, the C-node may be associated with a V-node corresponding to a current layer.

In some examples, the first calculating unit 101 may calculate a message of a V-node of a current layer using a min-sum algorithm. Conventionally, when a message of a C-node corresponding to previous repetitions is used in calculating a message of a V-node, an amount of memory needed may increase to store a C-node created in each repetition. However, a min-sum algorithm may allow for more effective storage of a message of a C-node. For example, the first calculating unit 101 may use, instead of a message of a C-node, a first absolute minimum value (|min|) of a message of each V-node connected to the C-node, a second absolute minimum value (|submin|) aside from the first absolute minimum value, a position (Index) of a V-node having an absolute minimum value, and sign bits of the V-nodes.

According to various aspects, to further reduce an amount of memory used, the first calculating unit 101 may store a first absolute minimum value (|min|) and a second absolute minimum value (|submin|) using a smaller bit than LLR data of a channel. For example, the first calculating unit 101 may store a most significant bit (f(|submin|$_{MSB}$) of a function value associated with a second absolute minimum value aside from a first absolute minimum value, instead of the second absolute minimum value (|submin|). Here, the function value associated with the second absolute minimum value may correspond to a difference (|submin|−|min|) between the second absolute minimum value and the first absolute minimum value, or may correspond to the second absolute minimum value (|submin|).

The second calculating unit 102 may calculate a message of a C-node. For example, the second calculating unit 102 may calculate a message of a C-node of a current layer using messages of all V-nodes that are associated with the C-node of the current layer.

The third calculating unit 103 may calculate LLR data of a channel, for example, using a message of a V-node and a message of a C-node.

Figure 2:
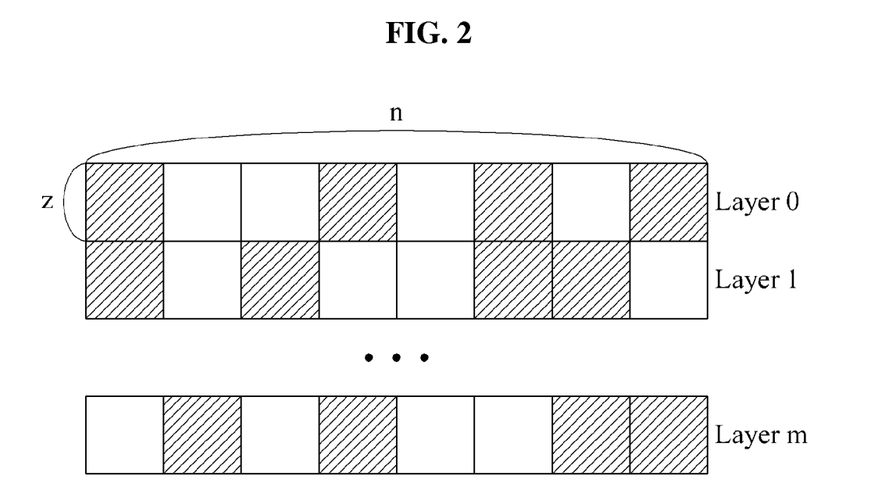
FIG. 2 is a diagram illustrating an example of a hierarchical matrix structure of an LDPC code.

FIG. 2 illustrates an example of a hierarchical matrix structure of an LDPC code.

As an example, a hierarchical matrix structure of a quasi-cyclic LDPC code may have blocks of z×z as shown in FIG. 2. In this case, one layer may include N blocks of z×z.

Referring to FIG. 2, the LDPC code decoder may be implemented using a single instruction multiple data (SIMD) architecture due to the same scale of operation in horizontal and vertical directions. The SIMD may control a plurality of arithmetic units with one control signal. A layer may correspond to a row within a hierarchical matrix, including a group of blocks having a size z. According to various aspects, the LDPC code decoder may encode the hierarchical matrix of the LDPC code of FIG. 2, for each layer, repeatedly.

Figure 3:
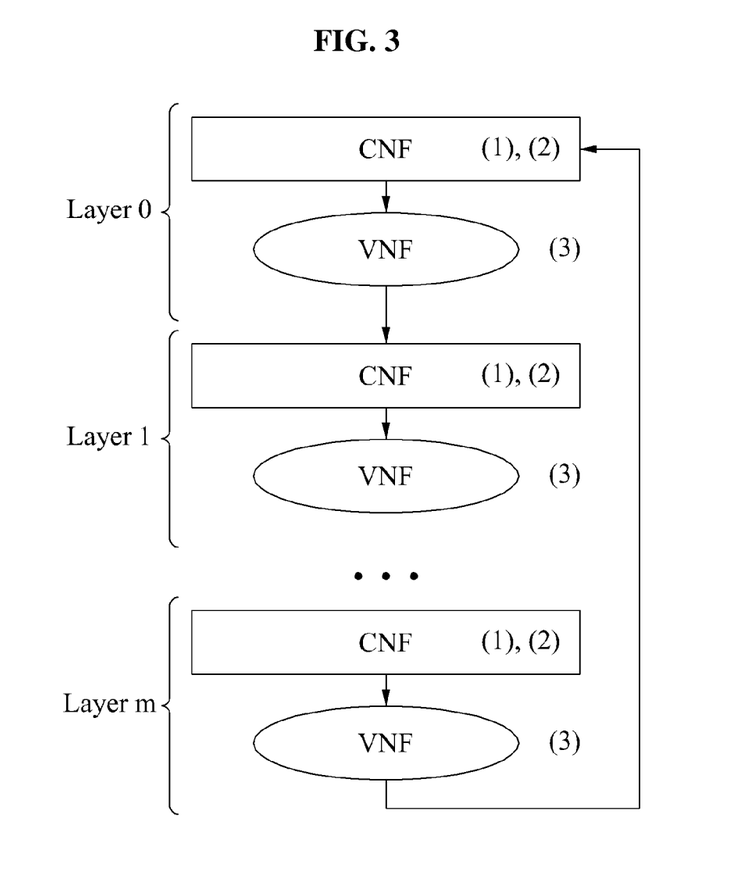
FIG. 3 is a diagram illustrating an example of a method of operating an LDPC code decoder.

FIG. 3 illustrates an example of a method of operating the LDPC code decoder.

Referring to FIG. 3, the LDPC code decoder may perform an operation for each layer. In this example, CNF corresponds to a function executed on a C-node, and VNF corresponds to a function executed on a V-node.

As an example, a message of a V-node, a message of a C-node, and LLR data of a channel may be calculated using the following Equation 1.

[Equation 1]

$$L_{nm}^{i,k} = L_n^{i,(k-1)} - R_{mn}^{(i-1),k} \quad (1)$$

$$R_{mn}^{i,k} = \prod_{n' \in N(m) \setminus n} \text{sign}(L_{n'm}^{i,k}) \times \min_{n' \in N(m) \setminus n} |L_{n'm}^{i,k}| \quad (2)$$

$$L_n^{i,k} = L_{nm}^{i,k} + R_{mn}^{i,k} \quad (3)$$

In Equation 1, (1) denotes a message of a V-node, (2) denotes a message of a C-node, and (3) denotes LLR data of a channel. Also, 'i' denotes a repeating number, 'k' denotes a layer number, 'n' denotes a V-node number, and 'm' denotes a C-node number.

Referring to (1) of Equation 1, a message $L_{nm}^{i,k}$ of a V-node may be calculated through a difference between LLR data $L_n^{i,(k-1)}$ of a channel corresponding to a previous layer and a message $R_{mn}^{(i-1),k}$ of a C-node corresponding to previous repetitions.

Referring to (2) of Equation 1, a message $R_{nm}^{i,k}$ of a C-node may be calculated by applying 'min' and 'sign' to messages $L_{n'm}^{i,k}$ of all V-nodes associated with the C-node aside from a message of a V-node of a current layer. In this example, the message $R_{nm}^{i,k}$ of the C-node may correspond to a value for correcting an error in LLR data of a channel. According to various aspects, in order to compute (2) of the foregoing Equation 1 more rapidly, an LDPC decoding accelerator may be added to a data path for a software defined ratio (SDR) system to improve throughput.

Referring to (3) of Equation 1, LLR data of a channel may be calculated by adding a message $L_{nm}^{i,k}$ of a V-node and a message $R_{nm}^{i,k}$ of a C-node corresponding to a current layer.

In (1) of Equation 1, messages of all C-nodes may be stored in a memory to use a result $R_{mn}^{(i-1),k}$ of decoding of previous repetitions. In this example, an amount of memory used to store the messages of the C-nodes may vary depending on characteristics of LDPC codes.

According to various aspects, an intermediate result $R_{mn}^{i,k}$ of repeated decoding may be effectively stored using a min-sum algorithm. In this example, according to a min-sum algorithm, a plurality of $R_{mn}^{i,k}$ information may be used, for example, by storing |min|, |submin|, 'index', and 'sign' in place of a value of $R_{mn}^{i,k}$.

In this example, |min| is an absolute minimum value of a message of each V-node connected to a C-node of a current layer, and |submin| is an absolute minimum value aside from |min| For example, |min| may equal |submin|, depending on a particular case.

Furthermore, index is a position of a V-node having |min| and sign is sign bits of V-nodes.

To further reduce an amount of a memory used for decoding, |min| and |submin| may be stored using a bit smaller than LLR data of a channel. For example, |min| and |submin| of five bits may be converted into four bits using a min-sum algorithm in an LPDC code decoder of a digital video broadcasting-satellite-second generation (DVB-S2) standard.

According to various aspects, when storing a result of (2) of Equation 1 in a memory, |min|, f(submin|−|min|)$_{MSBs}$, 'index', and $d_c$ number of signs may be stored in an internal register, instead of $d_c$ number of $R_{mn}$, or |min|, |submin|, 'index', and $d_c$ number of signs. Here, $d_c$ denotes a number of V-nodes connected to a corresponding C-node.

Here, f(|submin|)$_{MSBs}$ corresponds to a most significant bit (MSB) for a function value of a second absolute minimum value |submin|, and may be smaller than |submin|. As an example, f(|submin|) may correspond to |submin|. As another example for a high decoding performance, f(|submin|) may correspond to |submin|−|min| For example, in a case of DVB-S2, when |submin| and |min| are five bits, only two-bit MSB of five bits may be stored as f(|submin|−|min|)$_{MSBs}$.

To compute (3) of Equation 1, |min|, |submin|$_{approx}$, 'index', and 'sign' may be obtained by reading |min|, f(|submin|)$_{MSBs}$, 'index', and 'sign' stored in the memory. In this example, |submin|$_{approx}$ may be recovered by shifting bits to the left, with regard to the removed k-bits. That is, |submin| may be obtained by adding |min| after recovering f(|submin|−|min|)$_{approx}$ by adding zeros to a least significant bit (LSB) of f(|submin|−|min|)$_{MSBs}$.

In some aspects, |submin|$_{approx}$ may be recovered through the following Equation 2.

$$|submin|_{approx}=f^{-1}(f(|submin|)_{MSBs}<<k)$$

$$|submin|_{approx}=|min|+\{\{|submin|-|min|\}_{MSBs},000\ldots 00\}$$

[Equation 2]

After $R_{mn}$ is calculated using |submin|$_{approx}$, the LDPC code decoder may calculate LLR data $L_n$ of a channel by adding $L_{nm}$ and $R_{mn}$ corresponding to previous repetitions, and may store the LLR data $L_n$ of the channel in the memory.

According to various aspects, |submin| may be approximated using f(|submin|)$_{MSBs}$. This is because a function in a log domain used in a min-sum algorithm is represented by the following Equation 3.

$$\phi\left[\sum_{i'}\phi(\beta_{i'j})\right]\approx\phi\left[\phi\left(\min_{i'}\beta_{i'j}\right)\right]$$

$$=\min_{i'}\beta_{i'j}$$

$$L(r_{ji})=\prod_{i'\in R_{ji}}\alpha_{i'j}\cdot\min_{i'\in R_{ji}}\beta_{i'j}$$

According to various aspects, f(|submin|−|min|)$_{MSBs}$ may be stored in place of |submin|, because only 'min' is used in a min-sum algorithm in which a smallest value x in φ(x) influences a result. Aside from a case in which 'x' is close to '0', a change in φ(x) may be infinitesimal. Accordingly, when a value of |submin|−|min| is small, even though |min| replaces |submin|, a decoding performance may not be greatly affected. On the contrary, when a value of |submin|−|min| is large, |submin| may be used to prevent a reduction in decoding performance.

According to various aspects, a more efficient decoding performance may be obtained by recovering only |submin| in a case in which only a 2-bit MSB of |submin|−|min| is stored and thus a value of |submin|−|min| is large. That is, in a case in which decoding is performed using f(|submin|)$_{MSBs}$, particularly, in a case of f(|submin|)$_{MSBs}$={|submin|−|min|}$_{MSBs}$, a more efficient decoding performance may be obtained using |submin|=|min| when f(|submin|)$_{MSBs}$ is '0', and when f(|submin|)$_{MSBs}$ is not '0', a more efficient decoding performance may be obtained even though |submin|=|submin|$_{approx}$ is used.

Figure 4:
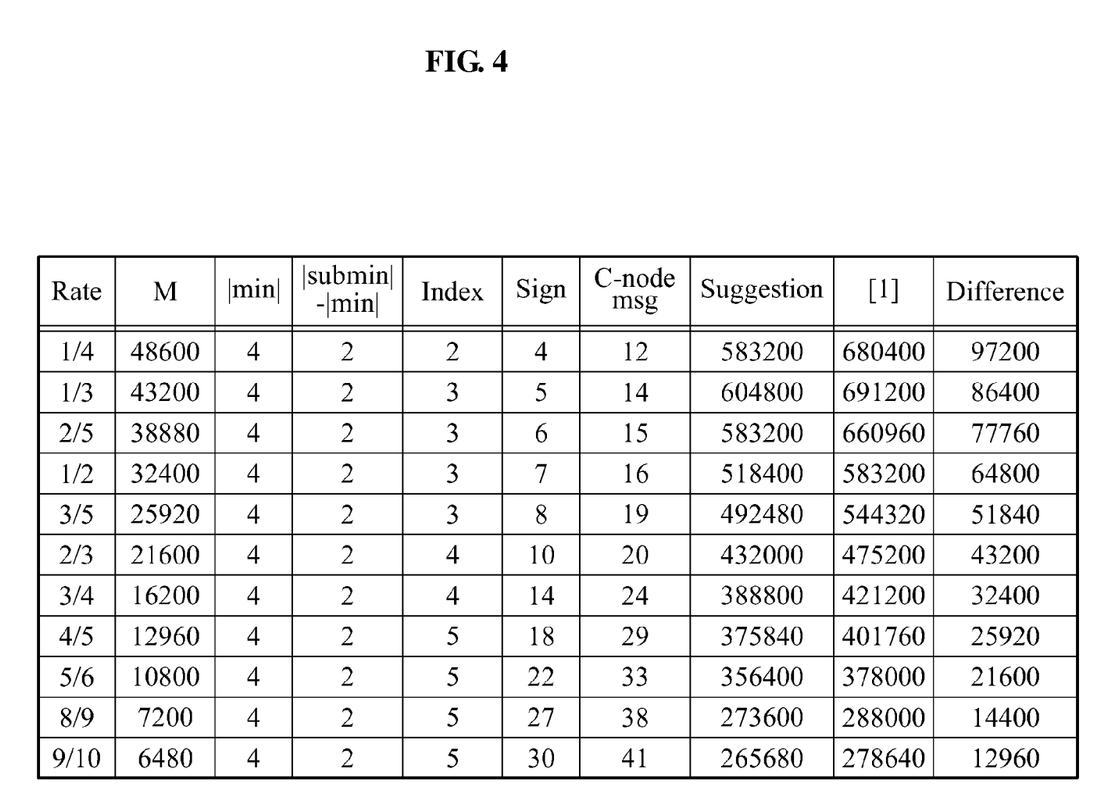
FIG. 4 is a diagram illustrating an example of a data bit used in an LDPC code decoder.
Figure 5:
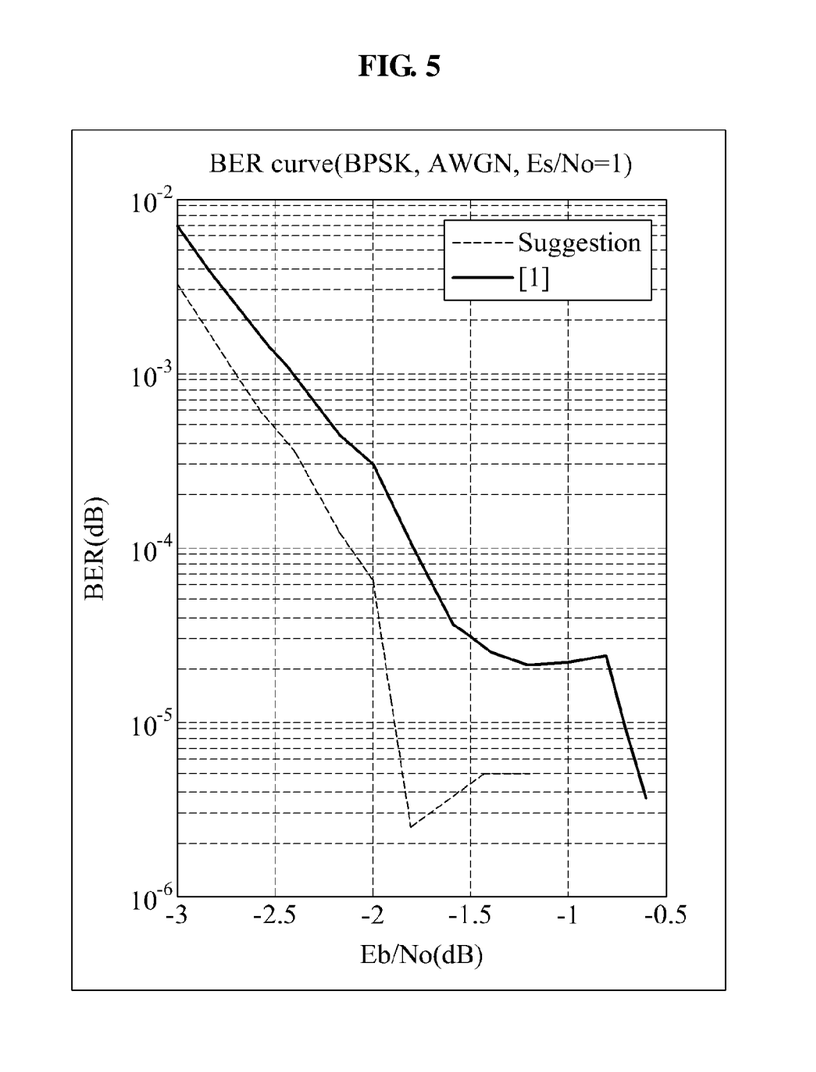
FIG. 5 is a diagram illustrating an example of a bit error rate (BER) in a digital video broadcasting-satellite-second generation (DVB-S2) long frame.

FIG. 4 illustrates an example of a data bit used in the LDPC code decoder and FIG. 5 illustrates an example of a bit error rate (BER) in a DVB-S2 long frame.

When data of the LDPC code decoder is stored as suggested according to various aspects, a decoding performance may be improved by using a smaller amount of memory in the LDPC code decoder allowing reset. By way of comparison to a conventional method, a calculated result of a number of bits needed to store all data necessary for decoding LDPC codes compliant to a DVB-S2 standard is shown in FIG. 5.

For example, when a code rate of 1/4 is used, an amount of memory of 97,200 bits may be saved in comparison to a case in which 5 bits are allocated to |submin| In this example, when a decoding method according to various aspects is used in decoding LDPC codes, a total amount of memory used is about 210,600 bytes, and when a conventional method is used, a total amount of memory used is 259,200 bytes. Accordingly, about 19% of an amount of memory may be saved.

Figure 6:
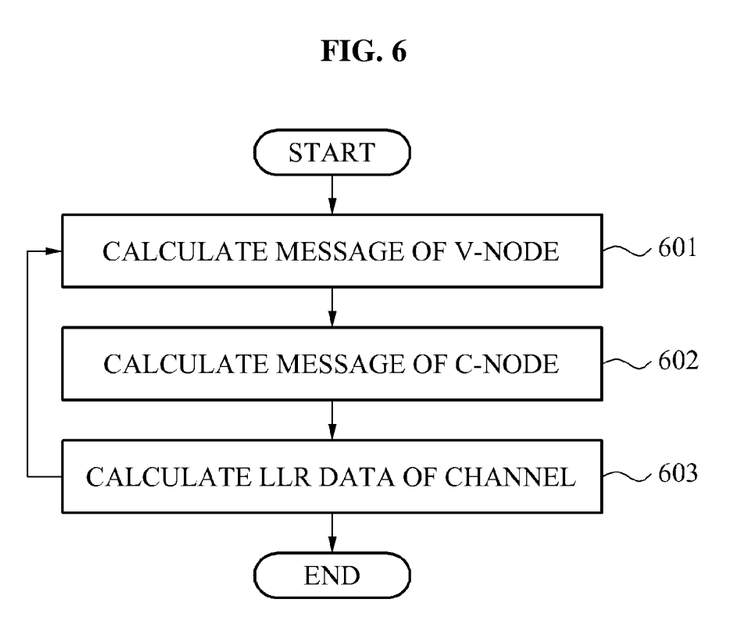
FIG. 6 is a flowchart illustrating an example of a decoding method for an LDPC code decoder.

FIG. 6 illustrates an example of a decoding method for the LDPC code decoder.

Referring to FIG. 6, in 601, the LDPC code decoder calculates a message of a V-node. For example, the LDPC code decoder may calculate a message of a V-node corresponding to a current layer using LLR data of a channel corresponding to a previous layer and a message of a C-node corresponding to previous repetitions. In this example, the C-node may be associated with a V-node corresponding to a current layer.

According to various aspects, the LDPC code decoder may calculate a message of a V-node of a current layer using a min-sum algorithm. Conventionally, when a message of a C-node corresponding to previous repetitions is used in calculating a message of a V-node, an amount of memory needed may be increased to store a C-node created during each repetition. However, a min-sum algorithm according to various aspects allows for a more effective storage of a message of a C-node. According to a min-sum algorithm, the LDPC code decoder may use, instead of a message of a C-node, a first absolute minimum value (|min|) of a message of each V-node connected to the C-node, a second absolute minimum value (|submin|) aside from the first absolute minimum value, a position (Index) of a V-node having an absolute minimum value, and sign bits of the V-nodes.

To further reduce an amount of memory needed, for example, the LDPC code decoder may store a first absolute minimum value (|min|) and a second absolute minimum value (|submin|) using a bit smaller than LLR data of a channel. As an example, the LDPC code decoder may store a most significant bit (f(|submin|$_{MSB}$)) for a function value associated with a second absolute minimum value aside from a first absolute minimum value, in place of the second absolute minimum value (|submin|) Here, the function value associated with the second absolute minimum value may correspond to a difference (|submin|−|min|) between the second absolute minimum value and the first absolute minimum value, or may correspond to the second absolute minimum value (|submin|).

In 602, the LDPC code decoder calculates a message of a C-node. For example, the LDPC code decoder may calculate a message of a C-node of a current layer using messages of all V-nodes associated with the C-node of the current layer.

In 603, the LDPC code decoder calculates LLR data of a channel using the message of the V-node and the message of the C-node.

According to various aspects, there is provided a decoder and a method that may use a reduced amount of memory for decoding LDPC codes. Accordingly, LDPC codes may be decoded using a reduced amount of memory resulting in a more efficient decoding process.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory to (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A decoding method for a low-density parity-check (LDPC) code decoder, the decoding method comprising:
calculating a message of a variable node (V-node) corresponding to a current layer using log-likelihood ratio (LLR) data of a channel corresponding to a previous layer;
calculating a message of a check node (C-node) of the current layer using messages of V-nodes associated with the C-node of the current layer; and
calculating LLR data of a channel using the message of the V-node and the message of the C-node,
wherein the calculating of the message of the V-node, the calculating of the message of the C-node, and the calculating of the LLR data of the channel, for each of a plurality of layers, are repeatedly performed.

2. The method of claim 1, wherein the calculating of the message of the V-node comprises calculating the message of the V-node corresponding to the current layer using the LLR data of the channel corresponding to the previous layer and a message of a C-node corresponding to previous repetitions.

3. The method of claim 1, wherein the calculating of the message of the V-node comprises calculating the message of the V-node of the current layer using a min-sum algorithm.

4. The method of claim 1, wherein the calculating of the message of the V-node comprises calculating a message of a V-node of a current layer using a first absolute minimum value (|min|) of a message of each V-node connected to the C-node, a most significant bit (f(|submin|MSB)) for a function value associated with a second absolute minimum value aside from the first absolute minimum value, a position (Index) of a V-node having an absolute minimum value, and sign bits of each of the V-nodes.

5. The method of claim 4, wherein the function value associated with the second absolute minimum value corresponds to a difference between the second absolute minimum value and the first absolute minimum value.

6. The method of claim 4, wherein the function value associated with the second absolute minimum value corresponds to the second absolute minimum value.

7. A low-density parity-check (LDPC) code decoder comprising:
a first calculator configured to calculate a message of a variable node (V-node) corresponding to a current layer using log-likelihood ratio (LLR) data of a channel corresponding to a previous layer;
a second calculator configured to calculate a message of a check node (C-node) of the current layer using messages of V-nodes associated with the C-node of the current layer; and
a third calculator configured to calculate LLR data of a channel using the message of the V-node and the message of the C-node,
wherein the decoder calculates the message of the V-node, the message of the C-node, and the LLR data of the channel, for each of a plurality of layers, repeatedly.

8. The LDPC code decoder of claim 7, wherein the first calculator calculates the message of the V-node corresponding to the current layer using the LLR data of the channel corresponding to the previous layer and a message of a C-node corresponding to previous repetitions.

9. The LDPC code decoder of claim 7, wherein the first calculator calculates the message of the V-node of the current layer using a min-sum algorithm.

10. The LDPC code decoder of claim 7, wherein the first calculator calculates a message of a V-node of a current layer using a first absolute minimum value (|min|) of a message of each V-node connected to the C-node, a most significant bit (f(|submin|MSB)) for a function value associated with a second absolute minimum value aside from the first absolute minimum value, a position (Index) of a V-node having an absolute minimum value, and sign bits of each of the V-nodes.

11. The LDPC code decoder of claim 10, wherein the function value associated with the second absolute minimum value corresponds to a difference between the second absolute minimum value and the first absolute minimum value.

12. The LDPC code decoder of claim 10, wherein the function value associated with the second absolute minimum value corresponds to the second absolute minimum value.

13. A non-transitory computer-readable recording medium comprising a program for implementing a method of claim 1.

* * * * *